(12) United States Patent
Imai et al.

(10) Patent No.: US 7,688,591 B2
(45) Date of Patent: Mar. 30, 2010

(54) ELECTRONIC-COMPONENT-MOUNTING BOARD

(75) Inventors: Sadato Imai, Hachioji (JP); Satoru Kikuchi, Hachioji (JP); Koichi Fukasawa, Kofu (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 64 days.

(21) Appl. No.: 12/043,606

(22) Filed: Mar. 6, 2008

(65) Prior Publication Data
US 2009/0109631 A1    Apr. 30, 2009

(30) Foreign Application Priority Data
Mar. 6, 2007    (JP) .............................. 2007-056247

(51) Int. Cl.
*H05K 7/20* (2006.01)
*F21V 21/00* (2006.01)
*F21V 29/00* (2006.01)

(52) U.S. Cl. ........................ 361/704; 361/707; 361/720; 362/249; 362/294

(58) Field of Classification Search ........................ None
See application file for complete search history.

(56) References Cited

U.S. PATENT DOCUMENTS

| | | | |
|---|---|---|---|
| 5,119,174 A * | 6/1992 | Chen ............................ | 257/98 |
| 6,345,903 B1 * | 2/2002 | Koike et al. .................. | 362/241 |
| 7,284,882 B2 * | 10/2007 | Burkholder .................. | 362/294 |
| 7,335,926 B2 * | 2/2008 | Wang et al. .................... | 257/99 |
| 2003/0183824 A1 * | 10/2003 | Doi et al. ....................... | 257/79 |
| 2004/0056244 A1 * | 3/2004 | Marcus et al. ................ | 257/40 |

FOREIGN PATENT DOCUMENTS

JP    1261413    1/2006

\* cited by examiner

*Primary Examiner*—Gregory D Thompson
(74) *Attorney, Agent, or Firm*—Browdy & Neimark, PLLC

(57) ABSTRACT

The electronic-component-mounting board according to the present invention includes: a high-heat-dissipation substrate including a metal plate and a circuit pattern formed on a upper surface of the metal plate; an electronic component which is mounted on the high-heat-dissipation substrate and is electrically connected to the circuit pattern; and one external connection terminal which is disposed on the high-heat-dissipation substrate and provides electrical connection between the electronic-component-mounting board and an external device. The external-connection terminal is formed of a material having a thermal conductivity less than that of the metal plate and has at least one external electrode to which a lead wire is soldered. Therefore, the lead wire can be connected by soldering even on the high-heat-dissipation substrate. Accordingly, the reliability of the electrical connection is improved, and reduction in size and thickness of the electronic-component-mounting board can be achieved. In addition, the cost of the electronic-component-mounting board can be reduced.

11 Claims, 5 Drawing Sheets

ELECTRONIC-COMPONENT-MOUNTING BOARD

CROSS-REFERENCE TO THE RELATED APPLICATION

This application is based on and claims priority from Japanese Patent Application No. 2007-56247, filed on Mar. 6, 2007, the disclosure of which is incorporated herein by reference in its entirety.

BACKGROUND OF THE INVENTION

1. Field of the Invention

The present invention relates to an electronic-component-mounting board including: a high-heat-dissipation substrate including a metal plate and a circuit pattern formed on a thin insulation layer disposed on an upper surface of the metal plate; an electronic component mounted on the high-heat-dissipation substrate; and one external-connection terminal which is disposed on the high-heat-dissipation substrate and provides electrical connection between the electronic component and an external device.

2. Description of Related Art

In wiring boards for mounting electronic components, such as light-emitting diodes, that generate a relatively large amount of heat, appropriate measures for heat dissipation must be taken. For example, wiring boards are already known in which a metal substrate having high-thermal conductivity is used to mount electronic components such as light-emitting diodes elements which are electrically connected to a circuit pattern formed on an upper surface of the metal substrate. In one known example of a substrate having high heat dissipation characteristics, a thin insulating layer is provided on the upper surface of a metal plate, and a predetermined circuit pattern is formed on the insulating layer (see, for example, Japanese Design Registration No. 1261413).

FIG. 6 is a perspective view illustrating an example of an electronic-component-mounting board previously proposed by the present applicant. As shown in FIG. 6, a conventional electronic-component-mounting board 1 is composed of: a high-heat-dissipation substrate 2 in which a metal plate 2a, such as an aluminum plate, having high-thermal conductivity is used; a light-emitting unit 3 serving as an electronic component and mounted on a substantially central portion of the high-heat-dissipation substrate 2; and external-connection terminals 4 which are disposed on opposite end portions of the high-heat-dissipation substrate 2 to provide electrical connection to an external device (not shown).

The high-heat-dissipation substrate 2 has a predetermined circuit pattern (not shown) formed on the upper surface of the metal plate 2a with an insulating layer 5 therebetween. The light-emitting unit 3 is composed of: a plurality of light-emitting diode elements 6 disposed on the high-heat-dissipation substrate 2; and a light-transmitting resin 7 that encapsulates the light-emitting diode elements 6.

Conventionally, a female connector is used as each of the external-connection terminals 4. By fitting a male connector (not shown) in the female connector, electric power is supplied from the outside to the light-emitting-diode elements 6 through the circuit pattern.

However, when a female connector is used as each of the external-connection terminals 4, its connection is made through engagement with a male connector, and therefore electrical reliability in a long-term use is problematic. Moreover, the above connectors may serve as an obstacle to miniaturization and thickness reduction and are also expensive.

In view of the above, it is conceivable that a lead wire is directly soldered and connected to the circuit pattern of the high-heat-dissipation substrate avoiding use of the conventional connectors. However, in this case, during the soldering of the lead wire to a circuit pattern disposed on a thin insulating layer disposed on the high-heat-dissipation substrate, necessary heat for soldering easily escapes to the metal plate constituting the high-heat-dissipation substrate, and therefore, an excessive amount of time is required to increase the temperature of the lead wire junction to the melting point of the solder. On the other hand, if the entire electronic-component-mounting board is heated in order to reduce the time required to increase the temperature of the lead wire junction to the melting point of the solder, other components such as the electronic-component are overheated and damaged.

SUMMARY OF THE INVENTION

It is an object of the present invention to provide an electronic-component-mounting board having an external-connection terminal to which a lead wire can be directly soldered. With such an electronic-component-mounting board which avoids use of a conventional connector as the external-connection terminal, the reliability and durability in a long-term use can be enhanced, and reduction in size and thickness can be achieved.

In order to achieve the above object, the electronic-component-mounting board according to the present invention includes: a high-heat-dissipation substrate including a metal plate and a circuit pattern formed on an upper surface of the metal plate; an electronic component which is mounted on the high-heat-dissipation substrate and is electrically connected to the circuit pattern; and one external-connection terminal which is disposed on the high-heat-dissipation substrate and provides electrical connection between the electronic component and an external device. The external-connection terminal is formed of a material having a thermal conductivity less than that of the metal plate and has at least one external electrode to which a lead wire is soldered.

In one embodiment, the metal plate constituting the high-heat-dissipation substrate is formed from an aluminum plate having high-thermal conductivity.

Moreover, the external-connection terminal may be composed of one or two independent connection terminal.

When the external-connection terminal is composed of two terminals, the two terminals may be disposed on the high-heat-dissipation substrate, and spaced apart from each other.

In addition, in another embodiment, the electronic component includes a light-emitting unit including: a plurality of light-emitting diode elements disposed on the high-heat-dissipation substrate; and a light-transmitting resin that encapsulates the light-emitting diode elements.

DETAILED DESCRIPTION OF THE PREFERRED EMBODIMENTS

Preferred embodiments of the present invention will be explained in detail below with reference to the accompanying drawings.

Figure 1:
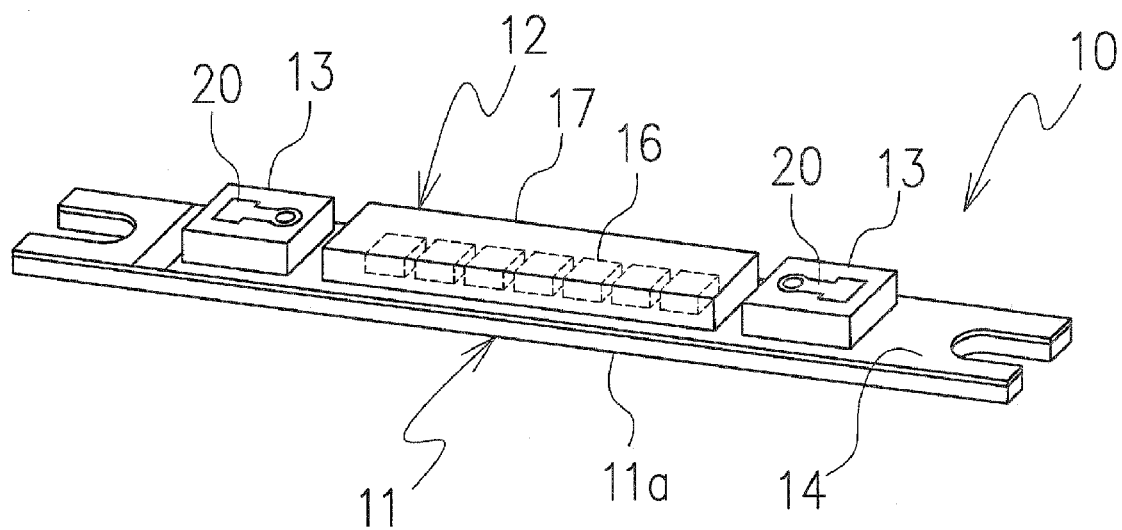
FIG. 1 is a perspective view illustrating an electronic-component-mounting board according to one embodiment of the present invention.

As shown in FIG. 1, an electronic-component-mounting board 10 according to one embodiment of the present invention includes: an elongated-plate-like-high-heat-dissipation substrate 11; a light-emitting unit 12 including an electronic component and mounted on a substantially central portion of the high-heat-dissipation substrate 11; and a pair of external-connection terminals 13 which are disposed on the left and right sides of the light-emitting unit 12 and provide electrical connection to an external device.

The high-heat-dissipation substrate 11 includes: a metal plate 11a, such as an aluminum plate, having high-thermal conductivity; a circuit pattern 15 (see FIG. 2B) formed in a predetermined shape on the upper surface of the metal plate 11a with an insulating layer 14 interposed therebetween. With this high-heat-dissipation substrate 11, heat generated from the electronic component constituting the light-emitting unit 12 is effectively dissipated.

The circuit pattern 15 may be formed by printing a circuit pattern in conductive paste on the insulating layer 14 which is disposed on the metal plate 11a. Also, the insulating layer 14 may be formed as an insulating coating by printing or applying a thin insulating sheet to the upper surface of the metal plate 11a. The circuit pattern 15 may be disposed by directly applying a thin insulating sheet having the circuit pattern 15 preformed thereon to the upper surface of the metal plate 11a.

The light-emitting unit 12 includes: a plurality of light-emitting diode elements 16 arranged in the longitudinal direction of the high-heat-dissipation substrate 11; and a light-transmitting resin 17 that encapsulates the light-emitting diode elements 16. In this embodiment, the light-emitting unit 12 is formed as an elongated-rectangular parallelepiped extending in the longitudinal direction of the high-heat-dissipation substrate 11.

As shown in FIG. 1, one external-connection terminal 13 is disposed on each of the left and right sides of the light-emitting unit 12. In the case that very small electronic components such as the light-emitting diode elements 16 are used, the size of the high-heat-dissipation substrate 11 on which the electronic components are mounted is also small, so that provision of the external-connection terminals 13 at spaced positions on both sides of the light-emitting unit 12 facilitates soldering operation.

Figure 2A:
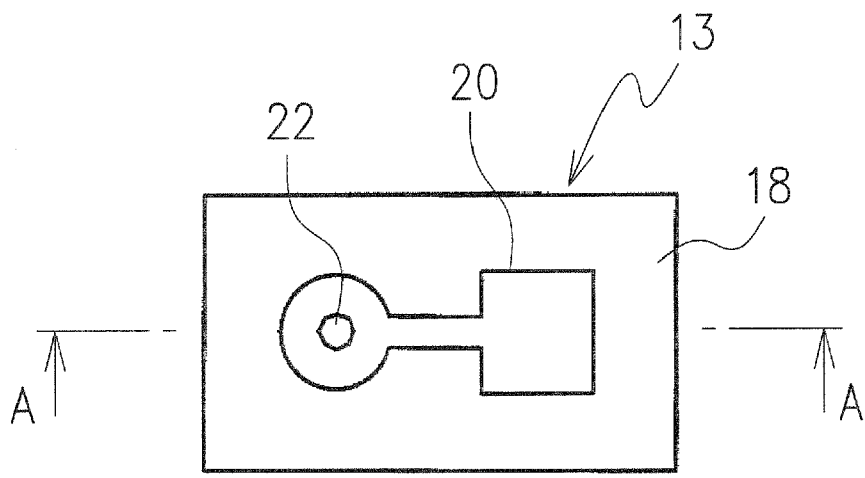
FIG. 2A is a top plan view of an external-connection terminal mounted on the electronic component-mounting board as shown in FIG. 1.
Figure 2B:
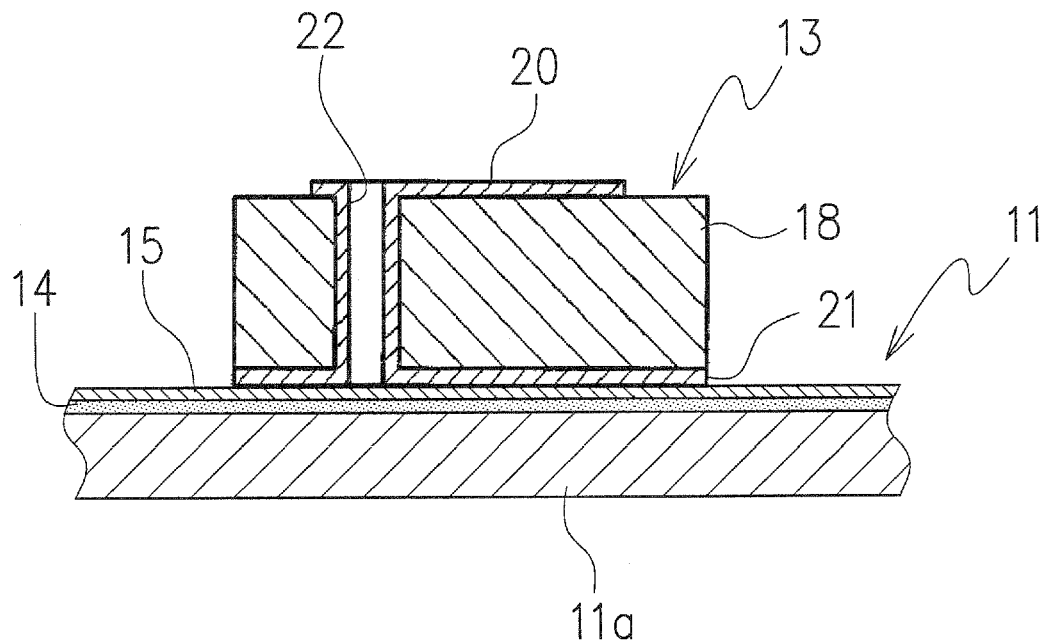
FIG. 2B is a cross-sectional view taken along the line A-A in FIG. 2A.

As shown in FIGS. 2A and 2B, each external connection terminal 13 is a component having a thermal conductivity less than that of the metal plate 11a constituting the high-heat-dissipation substrate 11, and each external connection terminal is composed of a resin substrate 18 which is made of a resin such as glass epoxy resin and is formed into a rectangular parallelepiped shape. An upper-surface electrode 20 as an external electrode is formed on the upper surface of the resin substrate 18, and one end of a lead wire 19 extending from an external device is soldered to the upper-surface electrode 20 (see FIG. 4). When the external-connection terminals 13 are disposed on both sides of the light-emitting unit 12 as in this embodiment, one of the upper-surface electrodes 20 is formed as a cathode electrode, and the other upper-surface electrode 20 is formed as an anode electrode.

As shown in FIG. 2B, a lower-surface electrode 21 for providing electrical connection to the circuit pattern 15 on the upper surface of the metal plate 11a is formed on the lower surface of the resin substrate 18. As with the upper-surface electrodes 20, one of the lower-surface electrodes 21 is formed as a cathode electrode, and the other lower-surface electrode 21 is formed as an anode electrode.

Moreover, in the present embodiment, as shown in FIGS. 2A and 2B, the upper-surface electrode 20 is electrically connected to the lower-surface electrode 21 through a through-hole electrode 22 disposed in and penetrating the resin substrate 18. In the present embodiment, a printed board laminated with copper foil on both sides thereof is used as the resin substrate 18. The upper-surface electrode 20 and the lower-surface electrode 21 may be formed by etching the copper foil on both sides in a predetermined pattern shape, and electrically connected by the through-hole electrode 22.

As shown in FIG. 2B, the lower-surface electrode 21 of each of the external-connection terminals 13 is bonded to the circuit pattern 15 formed on the upper surface of the metal plate 11a with a solder layer (not shown) therebetween and is thereby electrically connected to the circuit pattern 15. Also, the lower-surface electrode 21 of each of the external-connection terminals 13 may be bonded to the circuit pattern 15 of the high-heat-dissipation substrate 11 by eutectic bonding or a conductive paste without using the solder layer.

Figure 3:
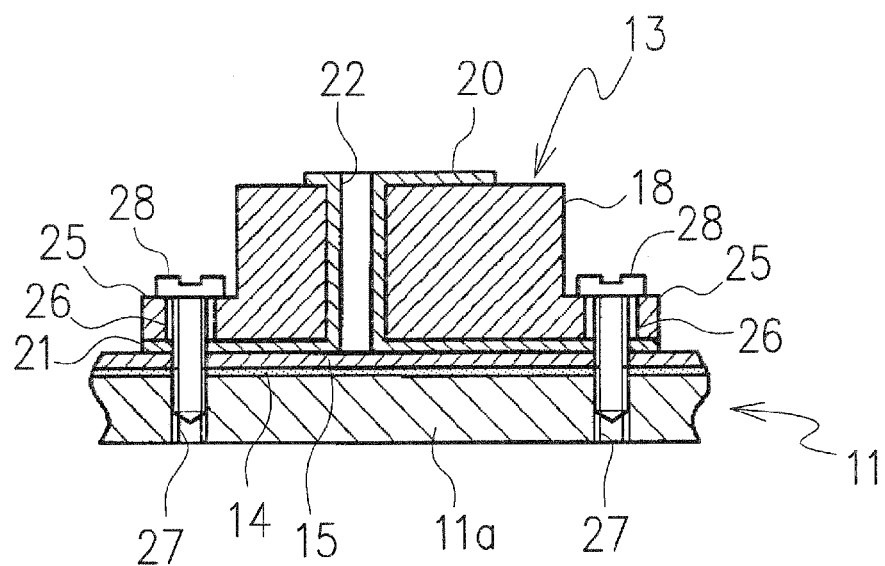
FIG. 3 is a cross-sectional view of another embodiment in which an external-connection terminal is screwed to the high-heat-dissipation substrate.

Moreover, as shown in FIG. 3, a pair of flange portions 25 formed by reducing thickness of the resin substrate 18 at a periphery thereof may be provided in each of the external-connection terminals 13. The external-connection terminal 13 may be screwed to the high-heat-dissipation substrate 11 with screws 28. In this case, holes 26 provided in and penetrating the flange portions 25 and internal-threaded holes 27 provided in the high-heat-dissipation substrate 11 are utilized. By fastening the external-connection terminal 13 at the flange portions 25, the lower-surface electrode 21 is brought into pressure contact with the circuit pattern 15 of the high-heat-dissipation substrate 11, and thus, the lower-surface electrode 21 and the circuit pattern 15 are electrically connected to each other. Note that the external-connection terminals 13 secured with the screws 28 are less affected by heat. Accordingly, an inexpensive material can be selected from a wide variety of materials.

Figure 4:
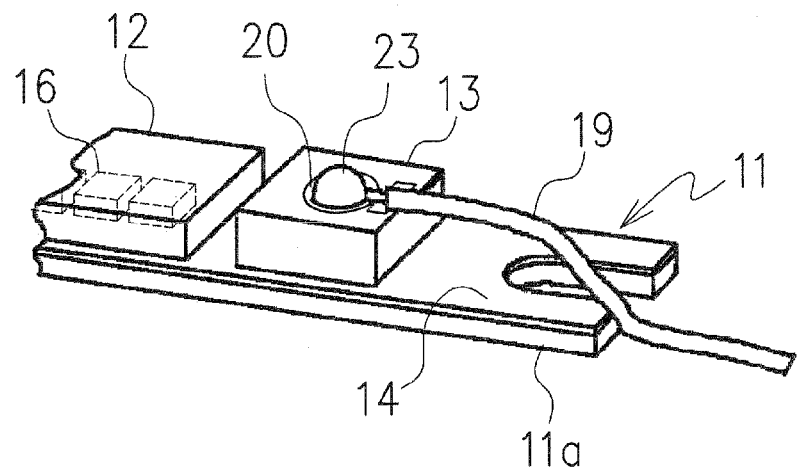
FIG. 4 is a perspective view illustrating a state in which a lead wire is connected to the external-connection terminal.

FIG. 4 shows a state in which the lead wire 19 is soldered to one of the external-connection terminals 13 disposed on the upper surface of the high-heat-dissipation substrate 11 in the electronic-component-mounting board 10 according to this embodiment. At the end portion of the lead wire 19, a coating is removed, and the end exposed portion is bonded to the upper-surface electrode 20 formed on the upper surface of the external-connection terminal 13 by solder 23 and thus, whereby the lead wire 19 is electrically connected to the circuit pattern 15 of the high-heat-dissipation substrate 11. Accordingly, electricity is supplied from the outside to each of the light-emitting diode elements 16 of the light-emitting unit 12.

The thermal conductivity of the external-connection terminal 13 of the present embodiment is less than that of the metal plate 11a constituting the high-heat-dissipation substrate 11. Hence, during the soldering of the lead wire 19, the necessary heat for soldering does not escape to the metal plate 11a-side because of the external-connection terminal 13. Accordingly, the lead wire 19 can be easily soldered to the upper-surface electrode 20. Also, a material constituting the package can be selected from a wide variety of materials having less thermal conductivity than a metal plate. In addition, the electrical reliability can be maintained for a longer period of time by configurations mentioned above.

Preferably, the solder 23 used for bonding the lead wire 19 to the upper-surface electrode 20 of the external-connection terminal 13 has a melting point lower than that of the solder (the solder layer) used for securing the external-connection terminal 13 to the high-heat-dissipation substrate 11.

In the above embodiment, a description has been given of the case in which each of the external-connection terminals 13 is formed from the resin substrate 18 (printed substrate) laminated with copper foil on both sides. However, the external-connection terminals 13 are not limited to the resin substrate 18. An insulating substrate formed of, for example, ceramic or glass having a thermal conductivity less that that of the high-heat-dissipation substrate 11 may be used. Moreover, an MID substrate having a thermal conductivity less than that of the high-heat-dissipation substrate 11 may also be used. In this case, no through-hole electrode is required.

Figure 5:
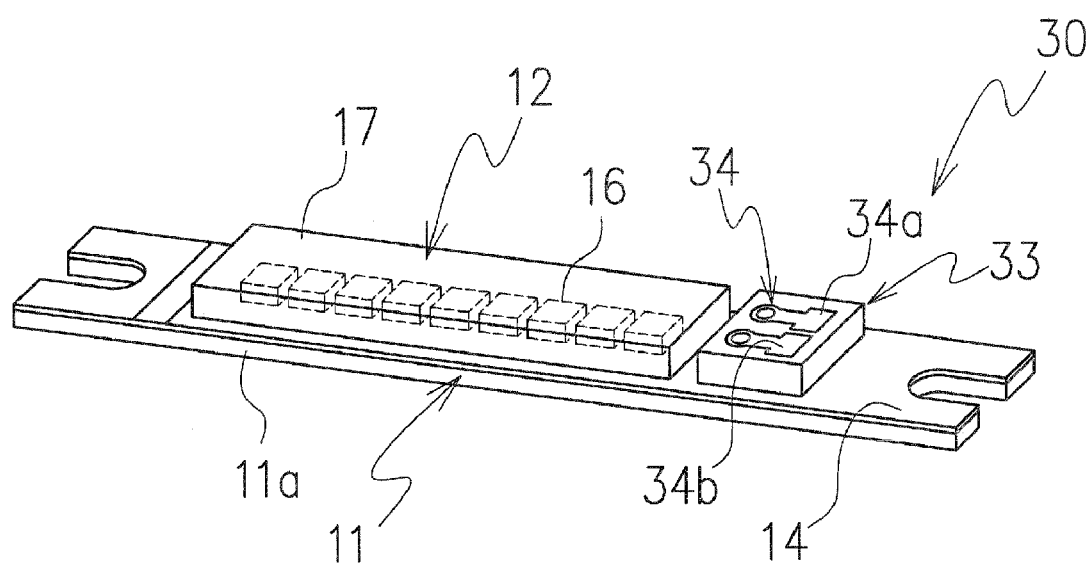
FIG. 5 is a perspective view illustrating an electronic-component-mounting board according to another embodiment of the present invention.
Figure 6:
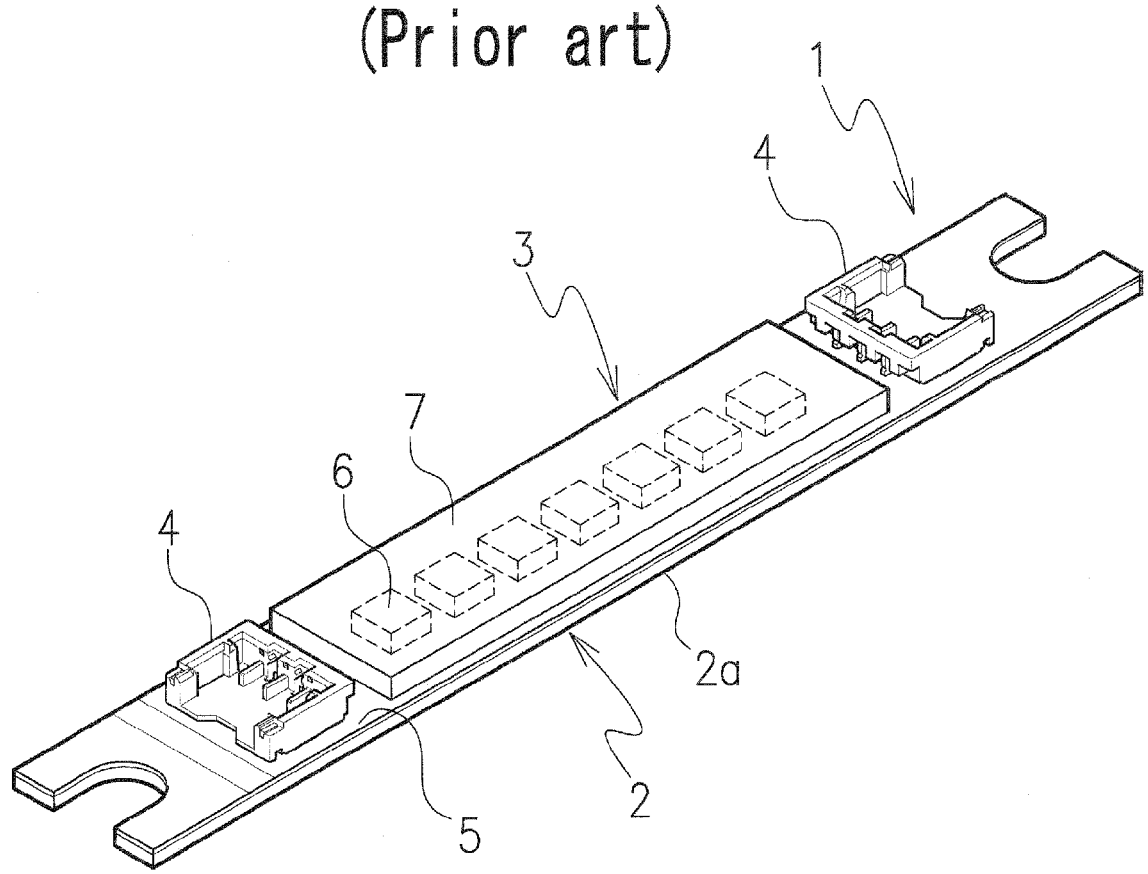
FIG. 6 is a perspective view illustrating an example of a conventional electronic-component-mounting board.

FIG. 5 shows another embodiment of the present invention. In an electronic-component-mounting board 30 according to this embodiment, an external-connection terminal 33 is disposed on only one side of the light-emitting unit 12, and an upper-surface electrode 34 composed of a cathode electrode 34a and an anode electrode 34b is formed on the upper surface of the external connection terminal 33. As with the upper-surface electrode 34, a lower-surface electrode formed on the lower surface of the external connection terminal 33 is also composed of a cathode electrode and an anode electrode. The anode and cathode electrodes of the upper surface and the lower surface are electrically connected by anode and cathode through-hole electrodes, respectively. When the high-heat-dissipation substrate 11 is sufficiently large in size, it becomes possible to form the cathode and anode electrodes into one external-connection terminal 33 as in this embodiment. In FIG. 5, the same components as those of the electronic-component-mounting board 10 of the previously described embodiment are designated by the same reference numerals, and their detailed descriptions will be omitted.

As with the above two embodiments, the external connection terminal may be disposed on each of opposite end portions of the high-heat-dissipation substrate or on only one end portion of the high-heat-dissipation substrate according to the size and arrangement of the electronic components.

In each of the above two embodiments, a description has been given of the light-emitting unit including a plurality of light-emitting diode elements serving as exemplary electronic components requiring a heat-dissipation structure, but the electronic components of the present invention are not limited thereto.

In the present invention, a component having a thermal conductivity less than that of the metal plate constituting the high-heat-dissipation substrate is used as the external-electrode terminal for supplying electric power from the outside to the electronic components mounted on the high-heat-dissipation substrate. Therefore, a lead wire can be connected by soldering. In this manner, a conventional connector is not required to be mounted on the high heat dissipation substrate. Accordingly, a reduction in size and thickness of the electronic-component-mounting board can be achieved, and the cost of the electronic-component-mounting board can be reduced.

While the preferred embodiments of the present invention have been described above, the present invention is not limited to these embodiments. It should be noted that various modifications and variations may be made to these embodiments.

What is claimed is:

1. An electronic-component-mounting board, comprising:
   a high-heat-dissipation substrate including a metal plate and a circuit pattern formed on an upper surface of the metal plate;
   an electronic component which is mounted on the high-heat-dissipation substrate and is electrically connected to the circuit pattern; and
   one external-connection terminal which is disposed on the high-heat-dissipation substrate and provides electrical connection between the electronic component and an external device, the external-connection terminal being formed of a material having a thermal conductivity less than that of the metal plate, the external-connection terminal having at least one upper-surface electrode to which a lead wire is soldered.

2. The electronic-component-mounting board according to claim 1, wherein the external-connection terminal includes at least one lower-surface electrode electrically connected to the circuit pattern of the high-heat-dissipation substrate, the lower-surface electrode being electrically connected to the upper-surface electrode.

3. The electronic-component-mounting board according to claim 1, wherein the external connection terminal includes the upper-surface electrode formed on the upper surface thereof, a lower-surface electrode formed on a lower surface thereof, and a through-hole electrode disposed therein and electrically connecting the upper-surface and lower-surface electrodes.

4. The electronic-component-mounting board according to claim 1, wherein the electronic component comprises a light-emitting unit including: a plurality of light-emitting diode elements electrically connected to the circuit pattern and disposed on the high-heat-dissipation substrate; and a light-transmitting resin that encapsulates the light-emitting diode elements.

5. The electronic-component-mounting board according to claim 1, wherein an insulation layer is disposed between the circuit pattern of the high-heat-dissipation substrate and the metal plate.

6. The electronic-component-mounting board according to claim 1, wherein the metal plate is an aluminum plate.

7. The electronic-component-mounting board according to claim 1, wherein the external-connection terminal is secured to the high-heat-dissipation substrate by any one of solder, eutectic bonding, conductive paste, and a fastening member.

8. The electronic-component-mounting board according to claim 1, wherein solder for securing the lead wire to the upper-surface electrode has a melting point lower than that of solder used for securing the external-connection terminal to the high-heat-dissipation substrate.

9. The electronic-component-mounting board according to claim 1, wherein the external-connection terminal is disposed on an end portion of the high-heat-dissipation substrate.

10. The electronic-component-mounting board according to claim 3, wherein the external-connection terminal is composed of two independent terminals, each including the upper-surface electrode, the lower-surface electrode and the through-hole electrode connecting the upper-surface and lower-surface electrodes.

11. The electronic-component-mounting board according to claim 3, wherein the external-connection terminal is composed of a single terminal that comprises a cathode electrode and an anode electrode, and each of the cathode electrode and the anode electrode includes the upper-surface electrode, the lower-surface electrode, and the through-hole electrode disposed in the single terminal and electrically connecting the upper-surface electrode and the lower-surface electrode.

* * * * *